United States Patent [19]
Bang

[11] Patent Number: 5,953,625
[45] Date of Patent: Sep. 14, 1999

[54] AIR VOIDS UNDERNEATH METAL LINES TO REDUCE PARASITIC CAPACITANCE

[75] Inventor: David Bang, Palo Alto, Calif.

[73] Assignee: Advanced Micro Devices, Inc., Sunnyvale, Calif.

[21] Appl. No.: 08/990,270

[22] Filed: Dec. 15, 1997

[51] Int. Cl.[6] .......................... H01L 21/28; H01L 21/302
[52] U.S. Cl. ..................... 438/619; 438/622; 438/669; 438/739
[58] Field of Search ..................... 438/619, 622, 438/627, 624, 666, 667, 669, 739

[56] References Cited

U.S. PATENT DOCUMENTS

| | | | |
|---|---|---|---|
| 5,308,440 | 5/1994 | Chino et al. | 438/619 |
| 5,310,700 | 5/1994 | Lien et al. | 438/618 |
| 5,319,237 | 6/1994 | Legros | 257/522 |
| 5,453,154 | 9/1995 | Thomas et al. | 216/18 |
| 5,814,555 | 9/1998 | Bandyopadhyay et al. | 438/619 |

FOREIGN PATENT DOCUMENTS

| | | |
|---|---|---|
| 4-11741 | 1/1992 | Japan . |
| 7-122710 | 5/1995 | Japan . |

*Primary Examiner*—T. N. Quach
*Attorney, Agent, or Firm*—Davis Chin

[57] ABSTRACT

A method for fabricating metal lines in multilevel VLSI semiconductor integrated circuit devices is provided so as to reduce parasitic capacitance. An undercutting etching step is performed so as to form trenches underneath the metal lines for accommodating air voids, followed by forming an intra-layer dielectric between the metal lines and into the trenches so as to form air voids underneath the metal lines. As a result, the parasitic capacitance will be decreased.

15 Claims, 3 Drawing Sheets

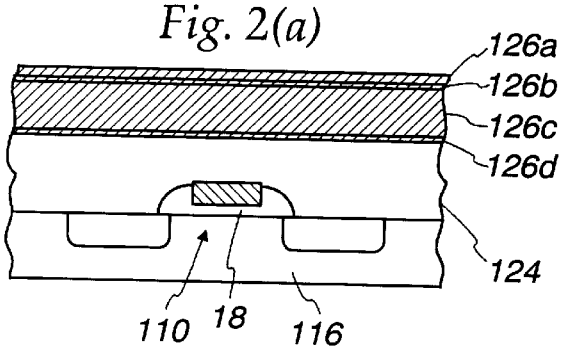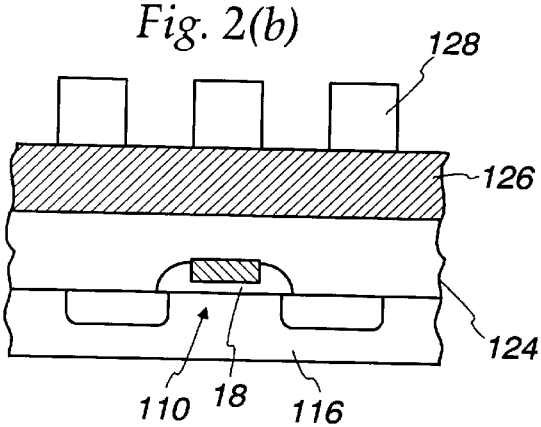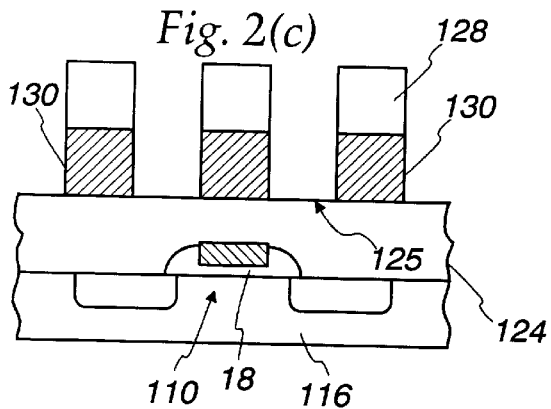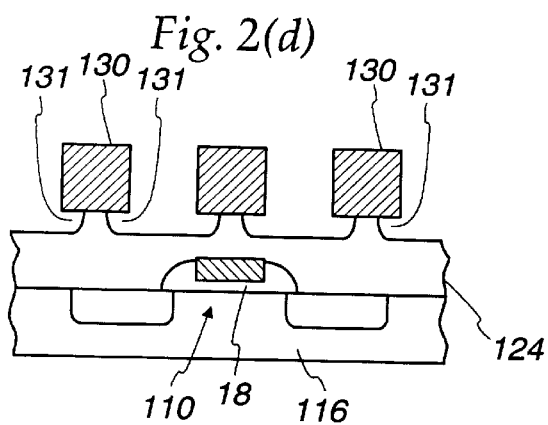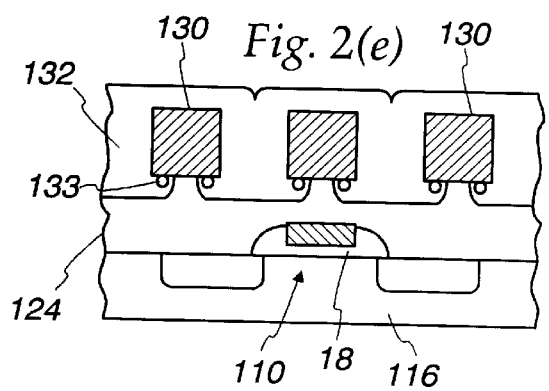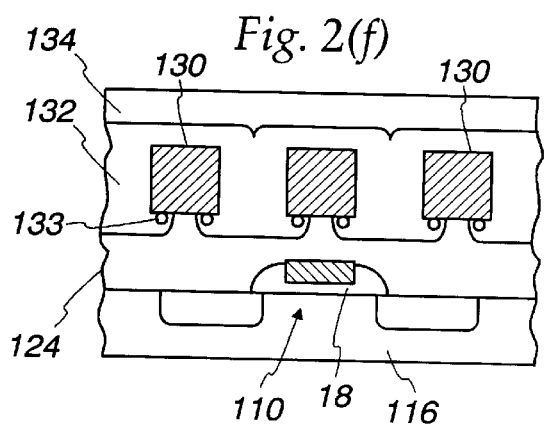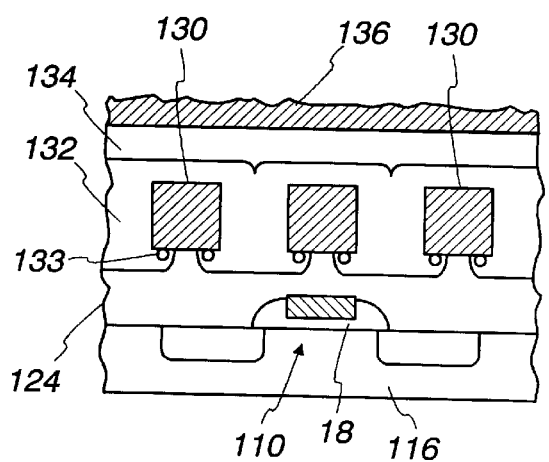

AIR VOIDS UNDERNEATH METAL LINES TO REDUCE PARASITIC CAPACITANCE

BACKGROUND OF THE INVENTION

1. Field of the Invention

This invention relates generally to methods for manufacturing electrical conductor lines or wiring for use in semiconductor integrated circuits. More particularly, it relates to an improved method for fabricating metal lines in multilevel VLSI semiconductor integrated circuit devices so as to reduce parasitic capacitance.

2. Description of the Prior Art

As is generally well-known in the semiconductor industry, there has existed a continuing trend of fabricating integrated circuits with extremely increased complexity and sophistication where literally millions and millions of active circuit devices are formed on or in a silicon substrate or well. The manufacturing of these complex, high-density, very-large-scale-integration (VLSI) semiconductor integrated circuits has been developed in part due to the advances made in integrated circuit fabrication technology where circuit components can now be made with dimensions on the order of sub-micron size. In addition, there has been developed new thin deposition technology which enables the formation of thin-films with precise composition and thickness at precisely defined locations.

Moreover, in order to maintain a relatively small die size, the VLSI semiconductor integrated circuit devices are typically fabricated with higher and higher densities by the process of using multilevel metal lines and metallized interconnect structures for connecting between the multiple levels. The multiple level layers of metal lines are generally separated by interlevel dielectrics (for example, silicon dioxide) electrically coupled by metal-filled vias provided at selected areas within the dielectric layers. The vias are filled with a plug and serve to make an electrical conduit between the different stacked multiple levels of the metal lines. The metal plug is typically formed of a refractory metal, such as tungsten.

In the stacked multiple levels, each of the metal line structures is formed using aluminum or aluminum alloys. However, since the interlevel dielectrics are being made with smaller and smaller thicknesses so as to accommodate the densely packed active circuits there will be created parasitic capacitance between one of the individual metal lines and the other remaining metal lines in the same level and in the other levels, thereby degrading the performance of the active circuits. In an article entitled "Use of Air Gap Structures To Lower Interlevel Capacitance" authored by J. G. Fleming and E. Roherty-Osmun of Sandia National Laboratories, there has been reported on the feasibility of creating an air gap between closely spaced metal lines so as to reduce interlevel capacitance, International DUMIC Conference, pp. 139–146, February, 1997.

Nevertheless, there still exists a need of a method for fabricating metal lines in multilevel VLSI semiconductor integrated circuit devices so as to reduce parasitic capacitance.

The present invention represents a significant improvement over the prior art techniques and thus provides a method for fabricating metal lines with decreased capacitance. This is achieved in the instant invention by performing an additional undercutting etching step so as to cut underneath the metal lines in order to form air voids thereafter.

SUMMARY OF THE INVENTION

Accordingly, it is a general object of the present invention to provide a method for fabricating metal lines in multilevel VLSI semiconductor integrated circuit devices so as to reduce parasitic capacitance.

It is an object of the present invention to provide a method for fabricating metal lines with air voids underneath the metal lines so as to reduce parasitic capacitance.

It is another object of the present invention to provide a method for fabricating metal lines so as to reduce parasitic capacitance which requires only minimal modification to the conventional VLSI fabrication process.

In accordance with a preferred embodiment of the present invention, there is provided a method for fabricating metal lines so as to reduce parasitic capacitance. A first dielectric layer is formed over a semiconductor substrate. A metallization stacked structure is formed over the first dielectric layer. A plurality of metal lines are formed by selectively etching portions of the metallization stacked structure. Trenches are formed underneath the plurality of metal lines by undercutting etching the plurality of metal lines. A second dielectric layer is formed between the plurality of individual lines and into the trenches so as to form air voids underneath the plurality of metal lines.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 2(a) through 2(g) are cross-sectional views, illustrating the manufacturing steps for fabricating metal lines with air voids, according to the principles of the present invention;

DESCRIPTION OF THE PREFERRED EMBODIMENT

As discussed above, the conventional VLSI fabrication process for multilevel metal lines includes the problem of parasitic capacitance between the metal lines when scaling-down which causes decreased performance and reliability of the active devices. The purpose of the present invention is to provide a method for fabricating metal lines in multilevel VLSI semiconductor integrated circuit devices so as to reduce parasitic capacitance. In view of this, the inventor of the instant invention has developed a way of using a single undercutting etching step which is added to the conventional VLSI fabrication process in order to achieve this result. Accordingly, the required modification to the conventional VLSI fabrication process is minimal and thus does not increase significantly the manufacturing costs. As a background and in order to provide a better understanding of the present invention, a description for the conventional VLSI fabrication steps for making multilevel metal lines over a MOS transistor device will hereinbelow be made initially along with the problem generated therefrom.

Figure 1A:
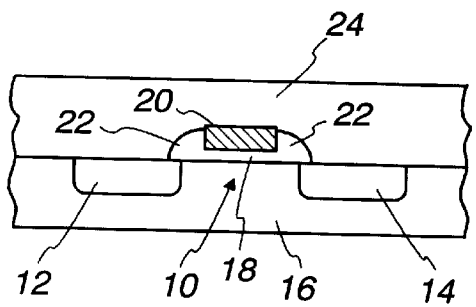
FIGS. 1(a) through 1(f) are cross-sectional views, illustrating the manufacturing steps for a conventional VLSI fabrication process for multilevel metal lines.

The conventional VLSI fabrication process will now be described with reference to the manufacturing steps shown in FIGS. 1(a) through 1(f) and labeled as "prior art." Since the present invention is directed to the fabrication of multilevel metal lines for use with a variety of integrated circuit components, the fabrication process will begin in FIG. 1(a) as applied, for example, to a MOS transistor device 10. It should be clearly understood by those skilled in the art that prior to the step of FIG. 1(a) the MOS transistor device 10 is formed by conventional MOS production steps.

As can be seen, the MOS transistor device 10 includes a source region 12 and a drain region 14 formed on a surface of a silicon substrate 16, a gate oxide film 18 formed on the substrate between the source and drain regions, a gate electrode 20 formed on the surface of the gate oxide film, and sidewall spacers 22 formed on both sides of the gate electrode. As shown in FIG. 1(a), a first interlayer dielectric 24, such as doped and undoped silicon dioxide, is formed over the transistor device for electrically isolating the different levels of metal lines in the silicon substrate. For the sake of clarity, the "vias" and "plugs" generally filled with tungsten that are used to form electrical connections between interconnection levels have been purposely omitted.

Figure 1B:
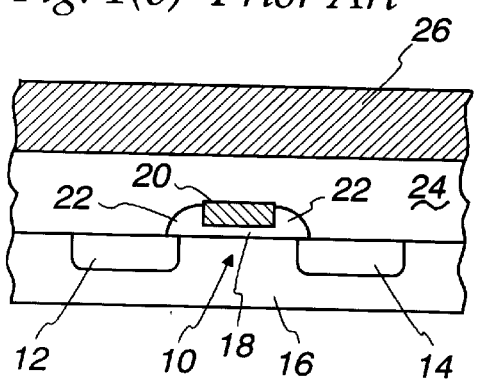
Figure 1C:
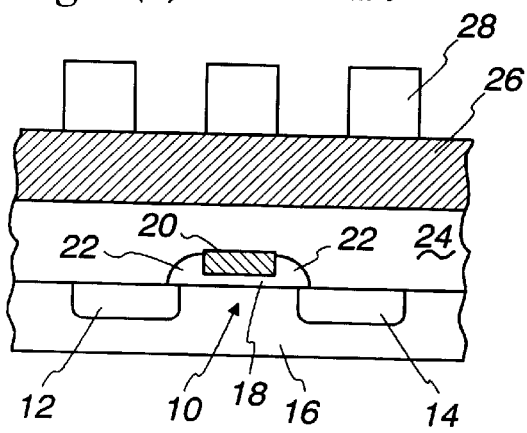
Figure 1D:
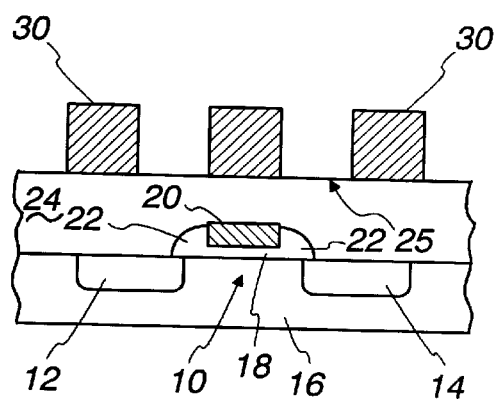

Next, a first metallization stacked structure 26 is deposited by physical or chemical vapor deposition on top of the first dielectric layer 24 which is illustrated in FIG. 1(b). Thereafter, the first metallization stacked structure 26 is patterned using a photoresist layer 28 as a mask in accordance with conventional photolithographic techniques, as depicted in FIG. 1(c). Following this, an anisotropic etching is performed and then the remaining photoresist layer is removed so as to form the individual metal lines 30, as shown in FIG. 1(d). It can be seen that the etching of the stacked structure 26 is stopped at the surface 25 of the first interlevel dielectric layer 24.

Figure 1E:
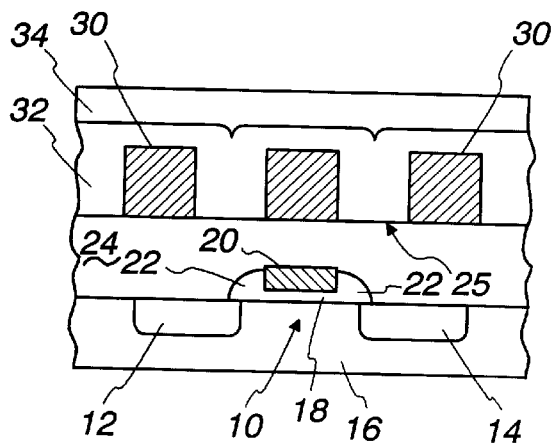
Figure 1F:
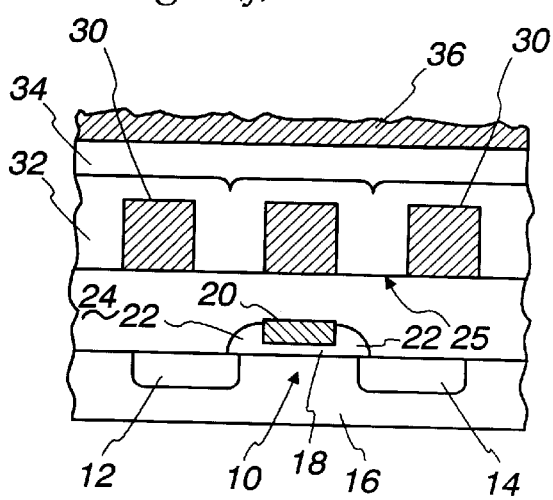

After the etching step, an intra-layer 32 is deposited between the metal lines 30 and on top thereof to a predetermined height. Thereafter, a second interlayer dielectric 34 of a predetermined height is deposited over the intra-layer 32, as illustrated in FIG. 1(e). Next, the "vias" and "plugs" (not shown) used to form the multilevel metal lines are formed. Then, a second metallization stacked structure 36 is deposited by physical or chemical vapor deposition on top of the second interlayer dielectric 34. This is depicted in FIG. 1(f). The process steps shown in FIGS. 1(c)–1(f) are repeated to form each additional layer of metallization.

As the size of the MOS transistor devices are being continuously scaled-down to smaller and smaller dimensions, the individual intra-level metal lines for each level of metallization are also being decreased in size so as to reduce the amount of chip area needed. As a result, the performance of the MOS transistor devices becomes limited by the interconnect delay which arises for the major part due to the intra-level capacitance. In order to solve this problem, the inventor has developed a simple process of providing air voids underneath the metal lines so as to reduce the intra-level parasitic capacitance. This is achieved very economically by an undercutting etching step, which does not require any additional equipment and can be performed with minimal modification to the conventional VLSI fabrication process.

In FIGS. 2(a) through 2(g) of the drawings, there is illustrated the method for fabricating metal lines with air voids underneath the metal lines in accordance with the principles of the present invention. Again, prior to the first step of FIG. 2(a), the MOS transistor device 110 is formed by conventional MOS production steps and includes the same elements of the MOS transistor 10 in FIG. 1(a).

After the formation of the MOS transistor device 110, a first interlayer dielectric 124, such as doped and undoped silicon dioxide, is formed over the transistor device 110 for electrically isolating the different multiple levels of metal lines in the silicon substrate 116. Likewise, for ease of illustration, the "vias" and "plugs" to form the interlevel connections have been omitted. Next, a first metallization stacked structure 126 is deposited by chemical vapor deposition on top of the first dielectric layer 124. This is illustrated in FIG. 2(a). The thickness or height of the first dielectric layer 124 is approximately 1.0 $\mu$m as measured between the bottom of the stacked structure 126 and the top of the silicon substrate 116.

While the first metallization stacked structure 126 is being represented symbolically by a single layer, it is preferably comprised of a four-layer structure. A first or bottom layer 126d of titanium (Ti) having a thickness of approximately 100 Å is applied to the top of the dielectric layer 124. The titanium layer functions as an adhesive layer. The second or conductive layer 126c having a thickness of approximately 5,000 Å is aluminum (Al) or aluminum-alloy film with 1% copper, or aluminum-alloy film with 1% silicon and 1% copper, and is applied to the top of the titanium layer. The third layer 126b of titanium having a thickness of approximately 100 Å is applied to the top of the aluminum or aluminum-alloy film. The fourth or top layer 126a is formed of titanium nitride (TiN) having a thickness of approximately 1,000 Å and is applied to the top of the titanium layer. The titanium/titanium nitride layers serve as anti-reflective coatings. It should be understood that each of the metallization stacked structures 126 can be formed in this manner.

Thereafter, the stacked structure 126 is developed and patterned using a photoresist layer 128 as a mask in accordance with conventional photolithographic techniques, as depicted in FIG. 2(b). Following this, an anisotropic etch is performed so as to form the individual metal lines 130, as shown in FIG. 2(c). It will be noted that the etching of the stacked structure is stopped at the surface 125 of the dielectric layer 124. Thus far, the steps of FIGS. 2(a) through 2(c) are identical to the steps of FIGS. 1(a)–1(d). The stacked structure 126 is preferably chemically etched.

After this etching step of FIG. 2(c) and before the application of the intra-level dielectric of FIG. 1(e), an undercutting etching step of the present invention is immediately performed so as to cut underneath the metal lines 130 forming trenches 131. Then, the remaining photoresist layer 128 is removed. This is illustrated in FIG. 2(d). This undercutting etching step is performed in the presence of various known chemistries. After the undercutting etching step, an intra-layer dielectric 132, such as silicon dioxide, is deposited between the metal lines 130 and into the trenches 131 so as to form air pockets or voids 133 under the metal lines, as shown in FIG. 2(e). The intra-layer dielectric 132 extends about 0.5 $\mu$m above the top surface of the metal lines. Next, a second interlayer dielectric 134 is deposited over the intra-layer dielectric 132 and has a thickness of about 0.2 $\mu$m. This is depicted in FIG. 2(f). Then, a second metallization stacked structure 136 is deposited by physical or chemical vapor deposition on top of the second interlayer dielectric 134. This is shown in FIG. 2(g). The process step shown in FIGS. 2(b)–2(g) are repeated to form each additional layer of metallization.

In the preferred implementation, the width dimension of the metal lines 130 is approximately 0.5 $\mu$m, and the height (thickness) dimension thereof is approximately 1.0 μm. The distance or spacing between any two metal lines is approximately 0.35 μm. Thus, the pitch is equal to 0.5 μm (width) plus 0.35 μm (spacing) or 0.85 μm. The air pockets 133 formed underneath the metal lines 130 serve to reduce the capacitance near the corners thereof which will tend to have the largest electric fields.

Figure 3:
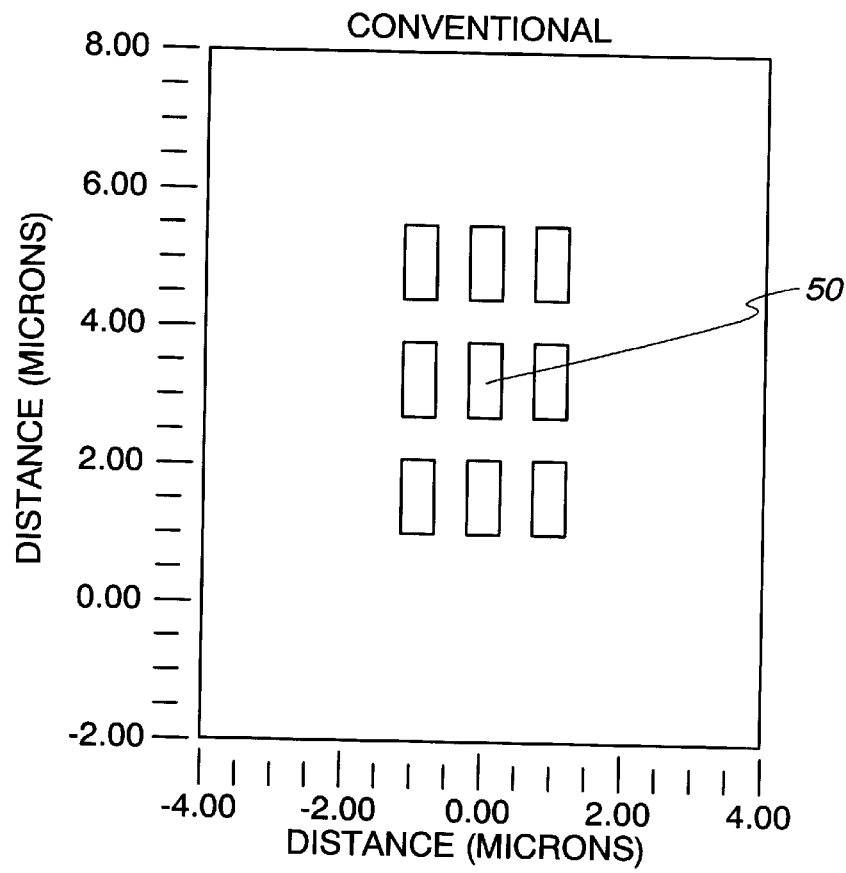
FIG. 3 is a simulated structure for a conventional 3-level layers of metal lines with 9 wires.
Figure 4:
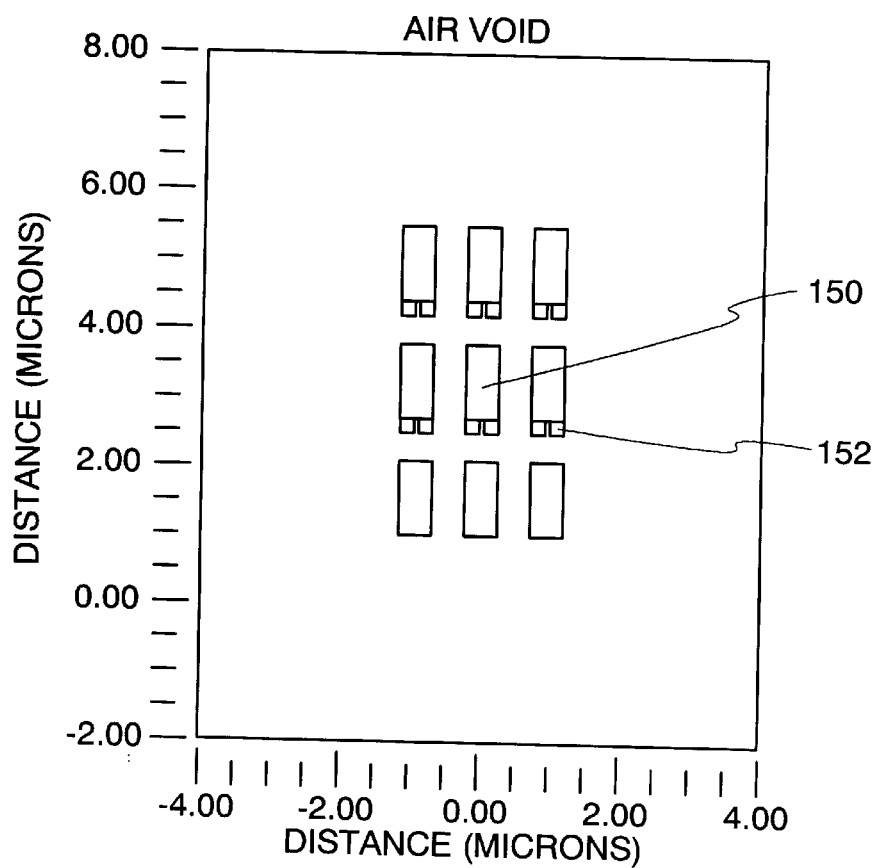
FIG. 4 is a simulated structure for a 3-level layers of metal lines with 9 wires and air voids formed thereunder.

In order to demonstrate the reduction of capacitance due to the air voids 133 formed underneath the metal lines 130 in accordance with the manufacturing steps of the present invention, Raphael computer models were created on a simulated structure for a conventional 3-level layers of metal lines with 9 wires as shown in FIG. 3, and on a simulated structure with air voids of the present invention containing 3-level layers of metal lines with 9 wires, as shown in FIG. 4. The total metal wire capacitance in FIG. 3 obtained between the metal line 50 and each of the remaining 8 wires was found to be approximately $3.46 \times 10^{-16}$ F/μm. By a similar calculation on FIG. 4, it was found that the total metal wire capacitance from the metal line 150 and each of the remaining 8 wires to be $3.24 \times 10^{-16}$ F/μm when the sizes of the air voids 152 were about 200 nm×200 nm. As a result, the capacitance was decreased by approximately 6.5% with the use of the air voids.

From the foregoing detailed description, it can thus be seen that the present invention provides a method for fabricating metal lines in multilevel VLSI semiconductor integrated devices so as to reduce parasitic capacitance. An undercutting etching step is performed so as to cut underneath the metal lines forming trenches which accommodate air voids.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

I claim:

1. A method for fabricating metal lines so as to reduce parasitic capacitance, said method comprising the steps of:

forming a first interlayer dielectric over a semiconductor substrate;

forming a metallization stacked structure over said first interlayer dielectric;

forming a plurality of metal lines by selectively etching portions of said metallization stacked structure;

forming trenches underneath said plurality of metal lines by undercutting etching of said plurality of metal lines; and forming a second intra-layer dielectric between said plurality of metal lines and into said trenches so as to form air voids underneath said plurality of metal lines.

2. A method for fabricating metal lines as claimed in claim 1, wherein said steps of forming the first interlayer dielectric, forming the metallization stacked structure, forming the plurality of metal lines, forming the trenches, and forming the second intra-layer dielectric are repeated to form an additional metallization layer.

3. A method for fabricating metal lines as claimed in claim 1, wherein each of said plurality of metal lines has a width of approximately 0.5 μm and a height of 1.0 μm.

4. A method for fabricating metal lines as claimed in claim 3, wherein spacings between any two of said plurality of metal lines is approximately 0.35 μm.

5. A method for fabricating metal lines as claimed in claim 4, wherein said first interlayer dielectric has a thickness of approximately 1.0 μm.

6. A method for fabricating metal lines as claimed in claim 5, wherein said second intra-layer dielectric has a thickness of approximately 0.5 μm.

7. A method for fabricating metal lines as claimed in claim 6, further comprising the step of forming a third interlayer dielectric over the second intra-layer dielectric.

8. A method for fabricating metal lines as claimed in claim 7, wherein said third interlayer dielectric has a thickness of approximately 0.2 μm.

9. A method for fabricating metal lines as claimed in claim 7, wherein said second and third dielectrics are silicon dioxide.

10. A method for fabricating metal lines as claimed in claim 1, wherein said air voids are approximately 200 nm×200 nm in dimension.

11. A method for fabricating metal lines as claimed in claim 1, wherein said first interlayer dielectric is silicon dioxide.

12. A method for fabricating metal lines as claimed in claim 1, wherein said stacked structure includes a conductive layer formed of an alloy of aluminum with 1% copper.

13. A method for fabricating metal lines as claimed in claim 12, wherein said conductive layer has a thickness of approximately 5,000 Å.

14. A method for fabricating metal lines as claimed in claim 1, wherein said stacked structure includes a conductive layer formed of an alloy of aluminum with 1% copper and 1% silicon.

15. A method for fabricating metal lines as claimed in claim 1, wherein said stacked structure includes a conductive layer formed of aluminum.

\* \* \* \* \*